(12) United States Patent
Kwan et al.

(10) Patent No.: US 10,181,496 B1
(45) Date of Patent: Jan. 15, 2019

(54) PROGRAMMABLE IMPEDANCE MEMORY DEVICE AND RELATED METHODS

(71) Applicant: Adesto Technologies Corporation, Sunnyvale, CA (US)

(72) Inventors: Ming Sang Kwan, San Leandro, CA (US); Venkatesh P. Gopinath, Fremont, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 160 days.

(21) Appl. No.: 15/143,310

(22) Filed: Apr. 29, 2016

(51) Int. Cl.
  *H01L 29/786* (2006.01)
  *H01L 27/24* (2006.01)
  *H01L 45/00* (2006.01)
  *G11C 13/00* (2006.01)

(52) U.S. Cl.
  CPC ........ *H01L 27/249* (2013.01); *G11C 13/0011* (2013.01); *G11C 13/0069* (2013.01); *H01L 27/2436* (2013.01); *H01L 45/085* (2013.01); *H01L 45/1233* (2013.01); *H01L 45/1253* (2013.01)

(58) Field of Classification Search
  None
  See application file for complete search history.

(56) References Cited

U.S. PATENT DOCUMENTS

| 6,310,798 B1 * | 10/2001 | Morimoto | G11C 11/38 257/E21.661 |
| 2009/0085121 A1 * | 4/2009 | Park | H01L 27/228 257/368 |

* cited by examiner

*Primary Examiner* — Ali Naraghi

(57) ABSTRACT

A memory device can include at least one plate structure formed over a semiconductor substrate; an active region formed within the semiconductor substrate without lateral isolation structures; a plurality of bit line contact groups, each including bit line contacts to the active region disposed in a first direction; a plurality of storage contact groups, each including storage contacts to the active region disposed in the first direction; a plurality of gate structures, each including a main section extending in the first direction, and disposed between one bit line contact group and an adjacent storage contact group; and a two-terminal storage element disposed between each bit line contact and the at least one plate structure.

9 Claims, 15 Drawing Sheets

US 10,181,496 B1

PROGRAMMABLE IMPEDANCE MEMORY DEVICE AND RELATED METHODS

TECHNICAL FIELD

The present disclosure relates generally to memory devices having programmable impedance elements, and more particularly architectures for such memory devices.

BACKGROUND

Memory devices that utilize programmable resistance elements to store data can provide advantages over other conventional memory types by providing lower operating voltages at relatively high densities. Further, some programmable resistance elements can be formed at the "bank-end" of an integrated circuit manufacturing process, and so not require substrate area. Thus, such elements can be easily incorporated into existing devices and/or processes.

One particular programmable resistance element can be a CBRAM type element. CBRAM elements can include one or more switching layers that can be programmed between two or more resistance states by application of electric fields. For example, an electric field applied in one direction can result in a higher resistance, while an electric field applied in other direction can result in a lower resistance. In some CBRAM elements, switching layers can undergo an oxidation-reduction reaction to arrive at such changes in resistance. The oxidation-reduction reaction may, or may not, include ion conduction.

DETAILED DESCRIPTION

Figure 1A:
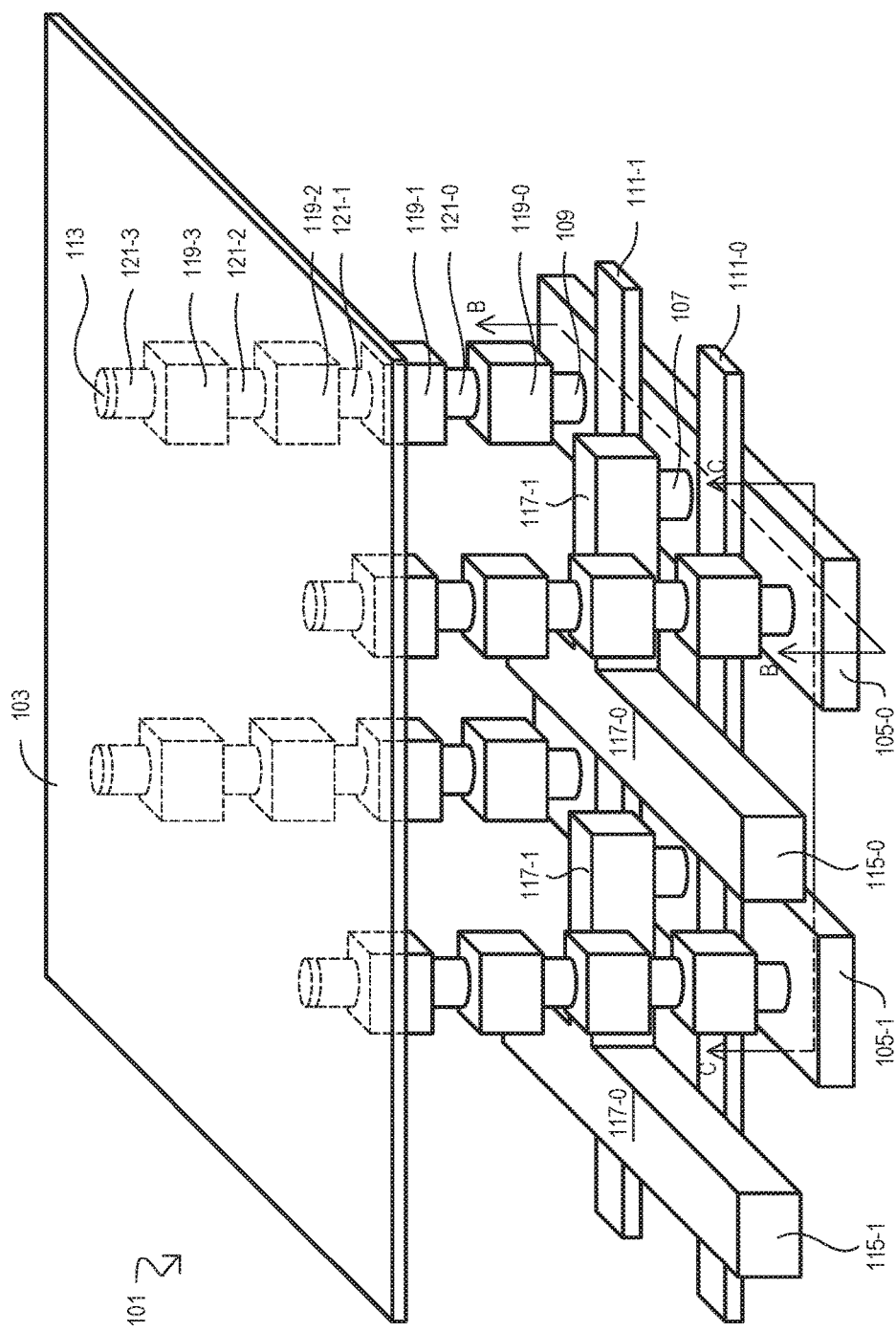
FIGS. 1A to 1D are various diagrams showing a memory device.

According to embodiments, a memory device can include programmable impedance storage elements, each having a conductive connection to a storage contact. The storage contacts can be arranged into groups, with each group of storage contact being commonly connected to a same bit line through a corresponding group of bit line contacts. In some embodiments, groups of bit line contacts in different rows can be connected to a same bit line. The configuration can be conceptualized as a "common bit line" architecture. In some embodiments, the storage contacts and bit line contacts can be formed in a same substrate region that does not include lateral isolation structures. Storage contacts can be conductively connected to bit line contacts with access devices formed by gate structures that extend in the row direction.

According to some embodiments, in addition to a common bit line, a memory device can include independent plate structures. Each independent plate structures can be commonly connected to, or form all or part of, an electrode for a group of storage elements. In a particular embodiment, groups of storage contacts can connect to storage elements in a row direction, while groups of plate structures can connect to storage elements in a column direction.

According to some embodiments, each gate structure can include a main sections and various second sections. A main section can extend between groups of storage contacts and a corresponding group of bit line contacts. Second sections can extend from the main section between adjacent storage contacts of the adjacent group of storage contacts. In a very particular embodiment, second sections can surround each storage contact. That is, a gate structure can completely surround each storage contact.

According to some embodiments, storage elements can be two terminal elements, programmable between different impedance states by application of electric fields. In particular embodiments, storage elements can be formed by a vertical stacking of layers which can include a bottom contact, one or more memory layers, and at top contact, which can include, or be conductively connected to, a corresponding plate structure. In particular embodiments, storage elements are programmable between different impedance states, at least in part, by an oxidation-reduction reaction induced by application of electric fields. Such an oxidation-reduction reaction may or may not include conduction of ions in one or more solid ion conducting materials. In very particular embodiments, storage elements can be CBRAM type elements.

Various embodiments will now be described with reference to drawings. In the various drawings, like items are referred to with the same reference characters but with the leading digits corresponding to the figure number.

FIGS. 1A-1E are diagrams showing an existing memory device 101 having CBRAM elements. In FIGS. 1A to 1E, like items are referred to by the same reference character.

FIG. 1A is a projection view of a memory device 101 that shows active regions 105-0/1, gate structures 111-0/1, and bit lines 115-0/1. Active regions 105-0/1 can be separated from one another by lateral isolation structures (shown in more detail in other views). Gate structures 111-0/1 can form access transistors (shown in more detail in other views) that can connect storage contacts (one shown as 109) to bit line contacts (one shown as 107). Gate structures 111-0/1 can extend in a single direction between adjacent storage contacts (e.g., 109) and bit line contacts (e.g., 107).

Bit lines 115-0/1 can have a long portion 117-0 and a short portion 117-1. Long portions 117-0 can extend perpendicular to gate structures 111-0/1 between active regions 105-0/1. Short portions 117-1 of bit lines 115-0/1 can extend off of long portions 117-0 to an adjacent bit line contact (e.g., 107).

It is understood that long portions 117-0 can extend across an array over multiple gate structures (e.g., 111-0/1).

Bit line contacts (e.g., 109) can have a conductive connection to a storage element (one shown as 113) by way of four metallization layers (M1/M2/M3/M4) (examples shown as 119-0/1/2/3) and corresponding vias (shown as 121-0/1/2/3). A storage elements (e.g., 113) can be formed of vertically stacked layers, and include a top plate 103 that can be common to a group of memory elements in both the row and column direction. A storage element (e.g., 113) can operate, at least in part, through an oxidation-reduction reaction, in which top plate 103 can serve as an all or part of an anode common to multiple storage elements. A storage element can be a CBRAM type memory element.

Figure 1B:
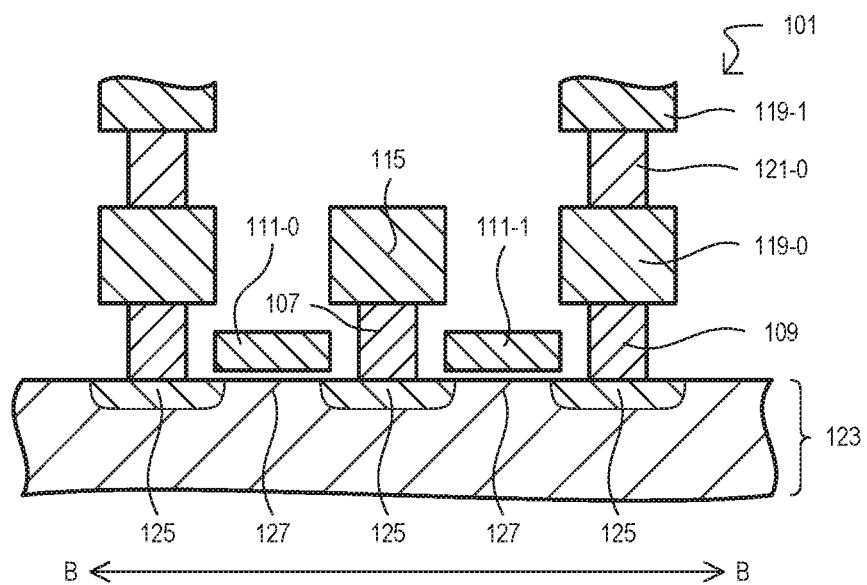

FIG. 1B is a side cross sectional view of memory device 101 taken along line B-B of FIG. 1A. As shown, storage contacts 109 and bit line contacts 107 can contact diffusion regions 125 formed in a substrate 123. Diffusion regions for bit line contacts can be separated from those of storage contacts by channel regions 127 formed below gate structures 111-0/1.

Figure 1C:
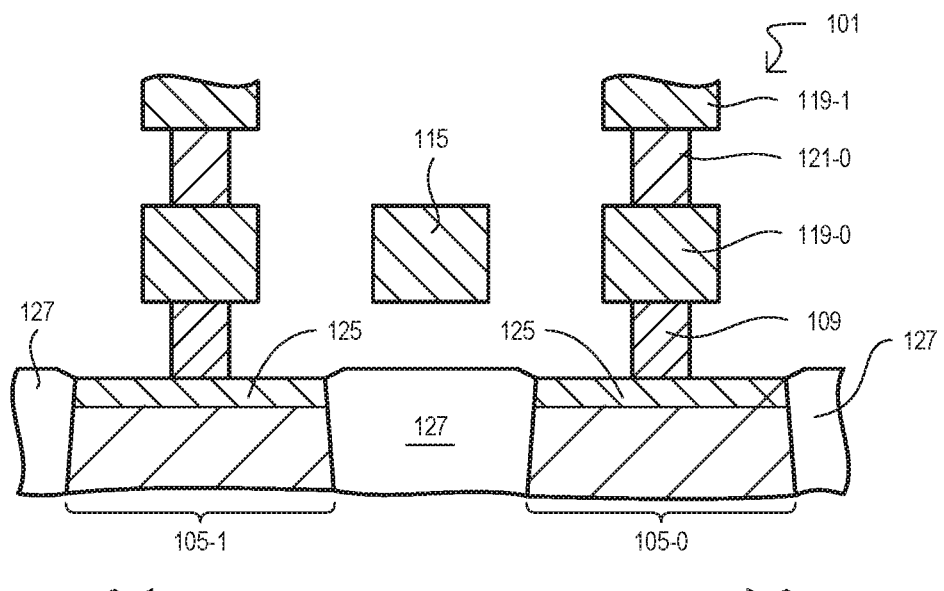

FIG. 1C is a side cross sectional view of memory device 101 taken along line C-C of FIG. 1A. As shown, in a direction parallel to the gate structures 111-0/1 (i.e., the direction of line C-C) active regions 105-0/1 can be separated from one another by isolation structures (one shown as 127). Isolation structures (e.g., 127) can be any suitable isolation structure including shallow trench isolation (STI) or field oxidation type structures.

Figure 1D:
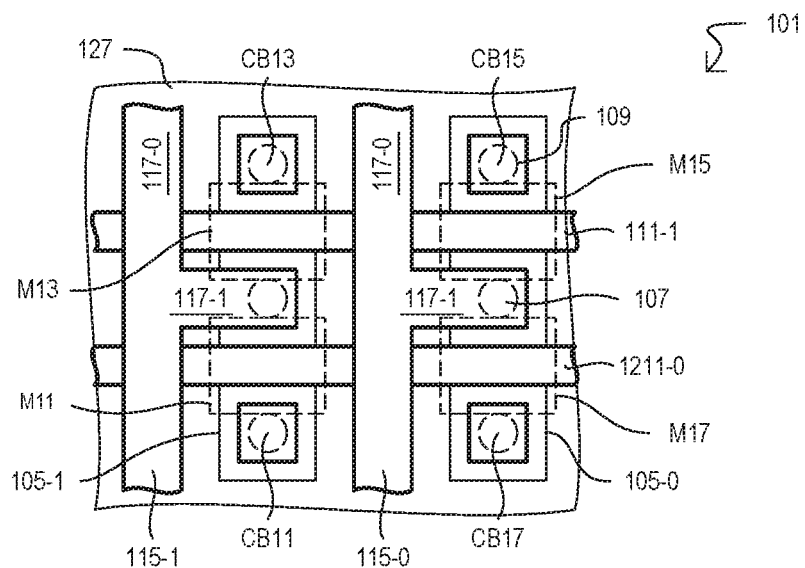

FIG. 1D is a top plan view of memory device 101 showing how gate structures 111-0/1 can form access transistors M11, M13, M15, M17 that can control conduction between bit lines 115-0/1 and storage elements CB11, CB13, CB15, CB17.

Figure 2:
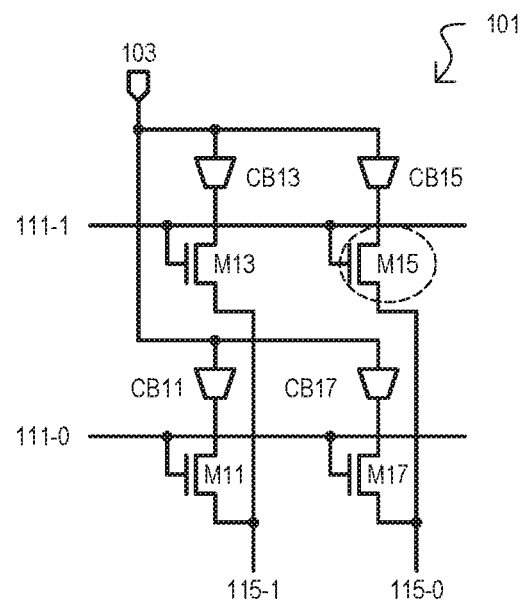
FIG. 2 is a schematic diagram of a memory device like that of FIGS. 1A to 1D.

FIG. 2 is a schematic diagram of memory device like that of FIGS. 1A-1D. Memory device 101 can be conceptualized as having a common anode (i.e., 103 common to multiple CBRAM storage elements, CB11/3/5/7) and independent bit lines (i.e., bit lines 115-0/1 provide independent paths to CBRAM storage elements, CB11/3/5/7).

While a memory device 101 like that of FIGS. 1A to 1D can provide good performance for many applications, at smaller technology nodes certain performance constraints can arise. At such more advanced nodes, transistor channel widths are smaller. Such smaller transistors (e.g., M11, M13, M15, M17) can provide smaller absolute channel current and a higher body effect. Consequently, it can be more difficult to provide sufficient current to erase some types of memory elements, such as CBRAM type elements.

Figure 3A:
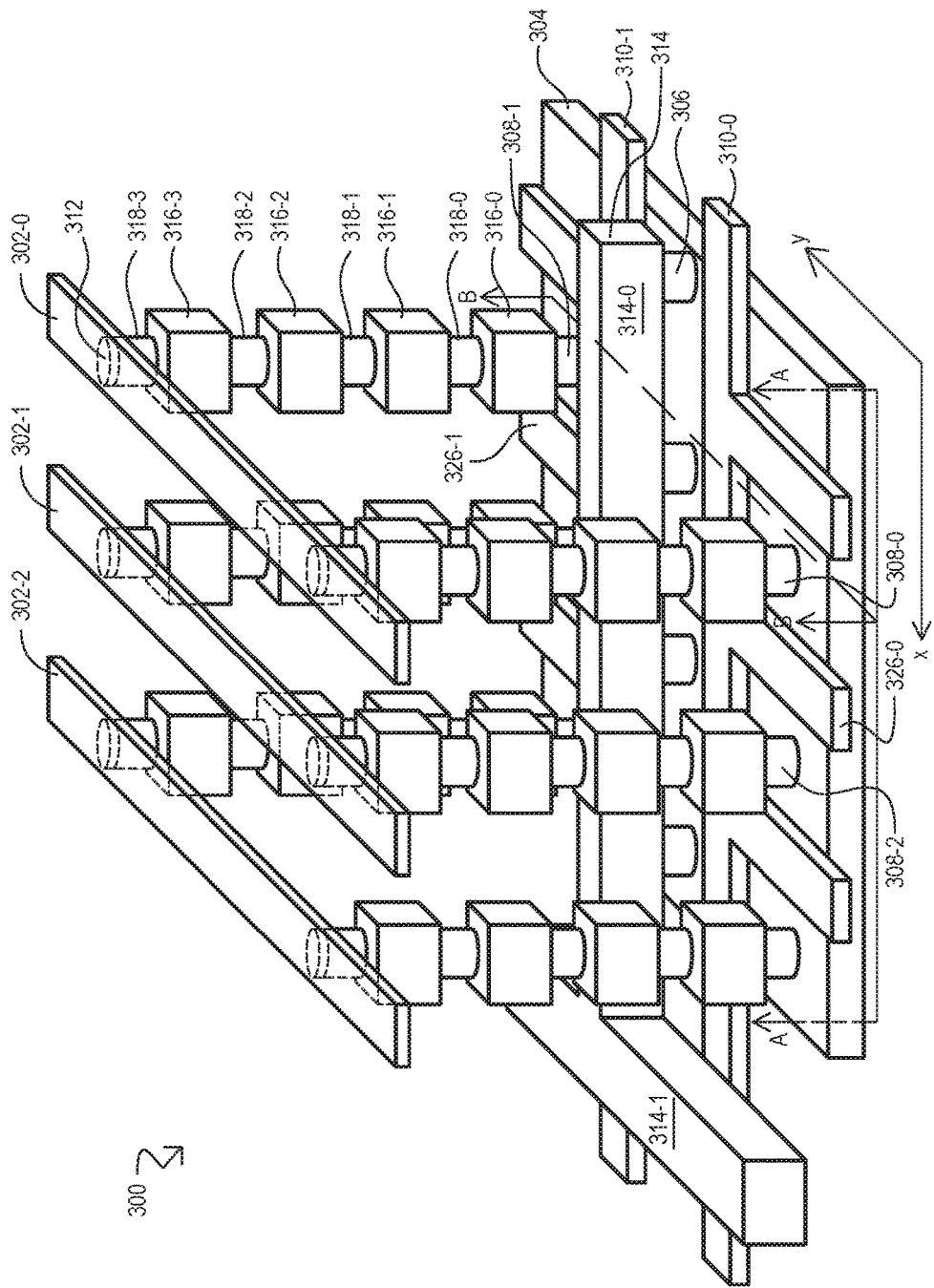
FIGS. 3A to 3C are diagrams showing a memory device according to an embodiment.
Figure 3B:
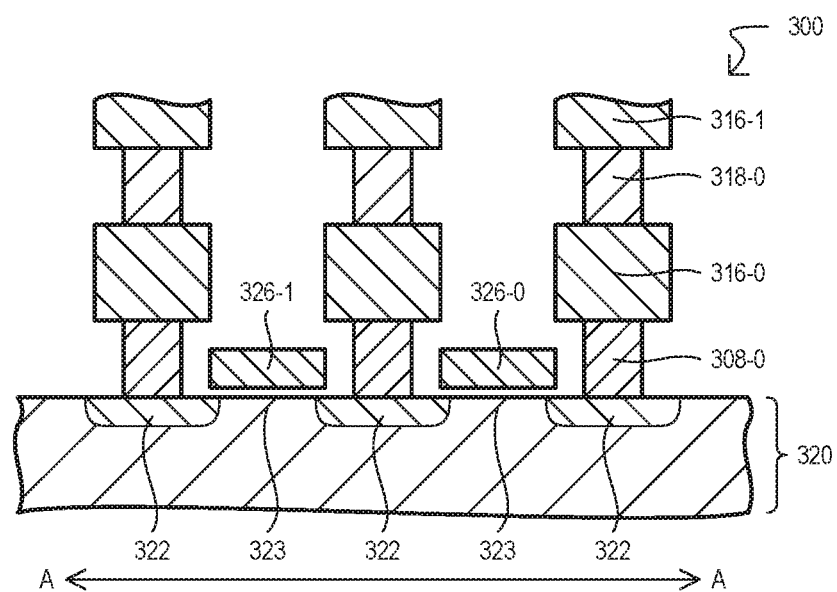
Figure 3C:
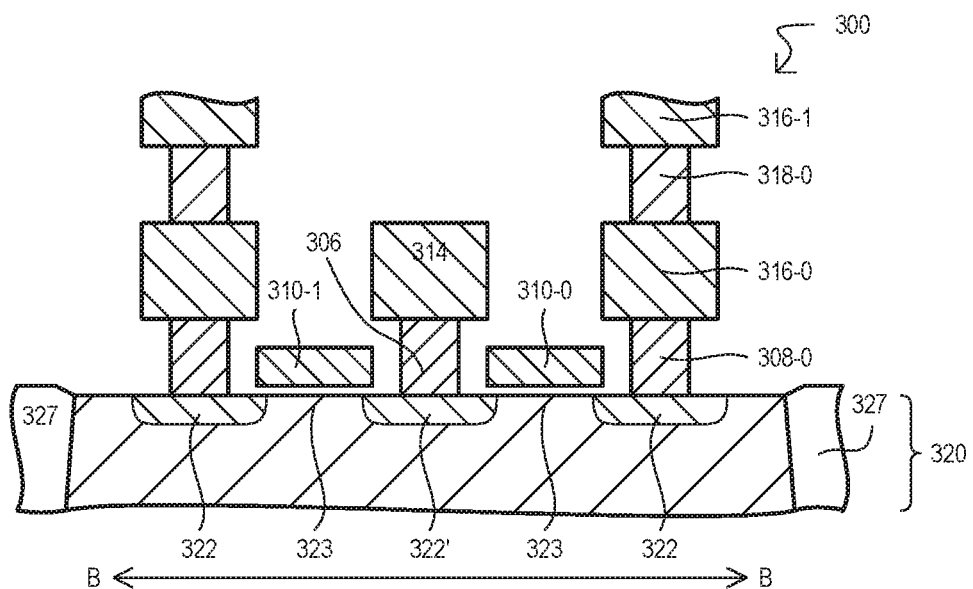

FIGS. 3A to 3C are diagrams of a memory device 300 according to an embodiment. A memory device 300 can include an active region 304, bit line contacts (one shown as 306), storage contacts (three shown as 308-0 to -2), gate structures 310-0/1, plate structures (three shown as 302-0 to -3), and bit lines (one shown as 314). Storage elements (one shown as 312) can be formed between plate structures (e.g., 302-0 to -2) and storage contacts (e.g., 308-0 to -2). Further, in some embodiments, plate structures (e.g., 302-0 to -2) can form part of a storage element (e.g., 312) (such as all or part of an electrode, or the like).

Storage contacts can be conductively connected to corresponding memory elements by one or more vertically extending conductive structures. For example, a conductive path between each storage contact and a corresponding storage element can be formed by one or more contacts, vias, or metallization (or other conductive material) patterns. In the particular embodiment shown, a memory device 300 can be fabricated with a four-metallization process, with each storage contact (e.g., 308-1) being conductively connected to a corresponding storage element (e.g., 312) by a first metallization pattern (e.g., 316-0), a first via (e.g., 318-0), a second metallization pattern (e.g., 316-1), a second via (e.g., 318-1), a third metallization pattern (e.g., 316-2), a third via (e.g., 318-2), and a fourth metallization pattern (e.g., 316-3). There can be a conductive structure (e.g., 318-3) formed on the fourth metallization pattern (316-3), which will be referred to as a fourth via (e.g., 318-3). However, it is understood that in some embodiments, this structure may form all or part of a storage element 312, such as an electrode or the like.

In some embodiments, storage elements (e.g., 312) can be a vertical structures formed by three or more layers vertically stacked on top of one another.

In particular embodiments, fourth vias (e.g., 318-3) can serve as a cathode of a storage element (e.g., 312) that operates, at least in part, through an oxidation-reduction reaction, in which plate structures (e.g., 302-0 to -2) can serve as all or part of an anode common to multiple storage elements. In one very particular embodiment, fourth vias (e.g., 318-3) can be cathodes, and plate structures (e.g., 302-0 to -2) can be anodes for CBRAM type storage elements.

A memory device 300 can be conceptualized as having storage contacts arranged in groups in row direction (shown by arrow "x"). For example, storage contact 308-0/2 can be in one group formed on one side of gate structure 310-0, while storage contacts 108-1 can be in another group formed on one side of gate structure 310-1. Similarly, bit line contacts can be viewed as being arranged into groups, also in the row direction. Thus, bit line contact 306 is in a bit line group situated between the above described storage contact groups. A bit line 314 can have a first portion 314-0 that extends over a bit line contact group in the row direction, and a second portion 314-1 that extends in a column direction (shown by arrow "y"). Plate structures (302-0 to -2) can extend in the column direction as well.

In the above arrangement, gate structures 310-0/1 can be conceptualized as generally extending in the row direction. However, gate structures 310-0/1 can also include gate extensions (two shown as 326-0/1) that project away from a main portion of the gate structure between adjacent storage contacts. For example, in the embodiment shown, gate extension 326-0 projects from a main portion of gate structure 310-0 between adjacent storage contacts 308-0 and 308-2. Gate extension 326-1 is shown to extend from a main portion of gate structure 310-1 between storage contact 308-1 and an adjacent storage contact in the row direction.

Referring to FIG. 3B, a memory device 300 is shown in a partial, side cross-sectional view taken along line A-A of FIG. 3A (in the x-direction). A substrate 320 can include channel regions 323 formed below gate extensions 326-0/1 and laterally between higher doped regions 322/322'. Higher doped regions 322 can correspond to storage contacts, while higher doped region 322' can correspond to a bit line contact 306. In this way, an access transistor can extend, not only directly between a storage contact (e.g., 308-0) and a bit line contact, but also between adjacent storage contacts, enabling such storage contacts (and their corresponding storage elements) to be more electrically isolated from one another during memory operations (e.g., program, erase and even read).

While channel regions 323 can have a same doping as a substrate 320, in some embodiments, channel regions can have a different doping from that of a substrate 320 (to arrive at a desired threshold voltage, for example).

It is understood that while embodiments may not include lateral isolation structures (i.e., isolation structures that provide electrical isolation in a direction parallel to a substrate surface), embodiments can include substrates having vertical isolation structures, such silicon-on-insulator (SOI) substrates, or the like.

In a particular embodiment, an active region 304 can be a p-doped substrate region that can be surrounded by (but not include) a lateral isolation structure, such as shallow trench isolation (STI). Gate structures (310-0/1) can be formed with polysilicon and create n-channel access transistors. Plate structures (302-0 to -2) can include a layer of metal oxide and an amorphous alloy.

Referring to FIG. 3C, a memory device 300 is shown in a partial, side cross-sectional view taken along line B-B of FIG. 3A (in the y-direction). A substrate 320 can include channel regions 323 formed below main portions of gate structure 314-0, between higher doped regions 322 for storage contacts 308-0 and bit line contact 306. Main portion of gate structure 314-0 can thus form a main portion of an access transistor between storage contacts and bit line contacts. Isolation structures 327 can define the edges of an active region. Isolation structures 327 can take the form of any suitable isolation structures including STI or some other field oxidation structure.

Figure 4A:
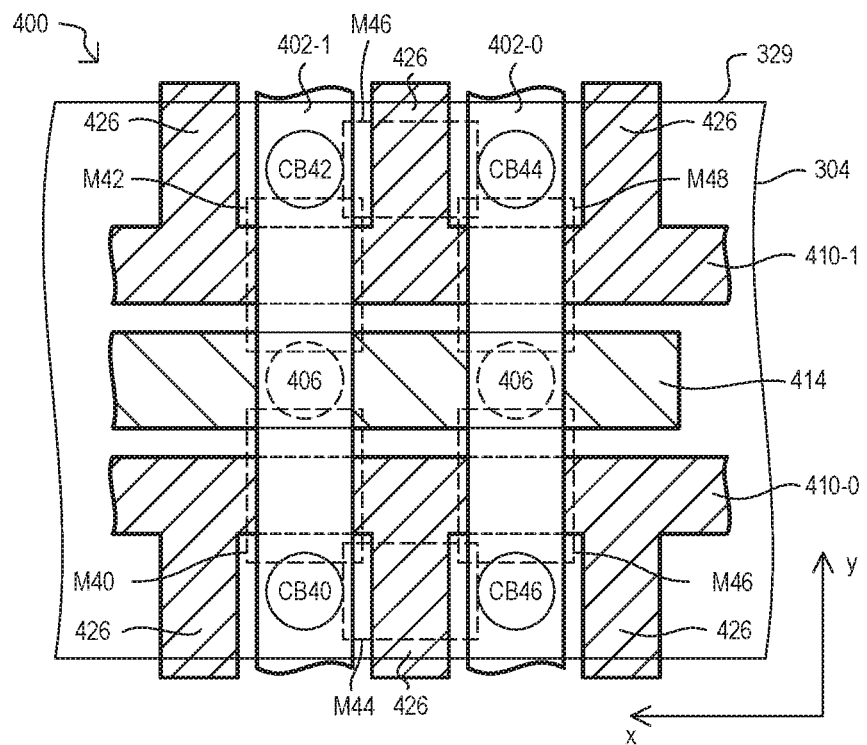
FIGS. 4A and 4B are a top plan view and schematic diagram for a memory device like that of FIGS. 3A/B.

FIG. 4A is a top plan view of a memory device 400 like that of FIGS. 3A to 3C. FIG. 4A shows two gate structures 410-0/1, a bit line 414, bit line contacts 406 (of a same bit line group), four memory elements CB40/CB42/CB44/CB46, and two plate structures 402-0/1. Memory elements CB40/CB46 can be vertically aligned over storage contacts of a first group (not shown), and memory elements CB42/CB44 can be vertically aligned over storage contacts of a second group (not shown).

As shown in FIG. 4A, gate structures 410-0/1 can form access transistors M40/M42/M44/M46 between bit line contacts 406 and storage contacts (below memory elements CB40/CB42/CB44/CB46). Gate structures 410-0/1 can also include gate extensions 426. Gate extensions 426 can extend over an active region edge 329, which delineates where an active region 304 ends, and an isolation structure (i.e., 327) begins. Such a gate shape can be conceptualized as forming lateral transistor structures M46/M44 extending between adjacent storage contacts in addition to the transistor structures M40/M44/M44/M46 between bit line contacts 406 and storage contacts.

Gate structures 410-0/1 can commonly control access transistors of a same row, and so can be considered word lines (WLs).

It is understood that the sizing and spacing of the various structures shown in FIG. 4A can be subject to considerable variation according to the fabrication process used.

Figure 4B:
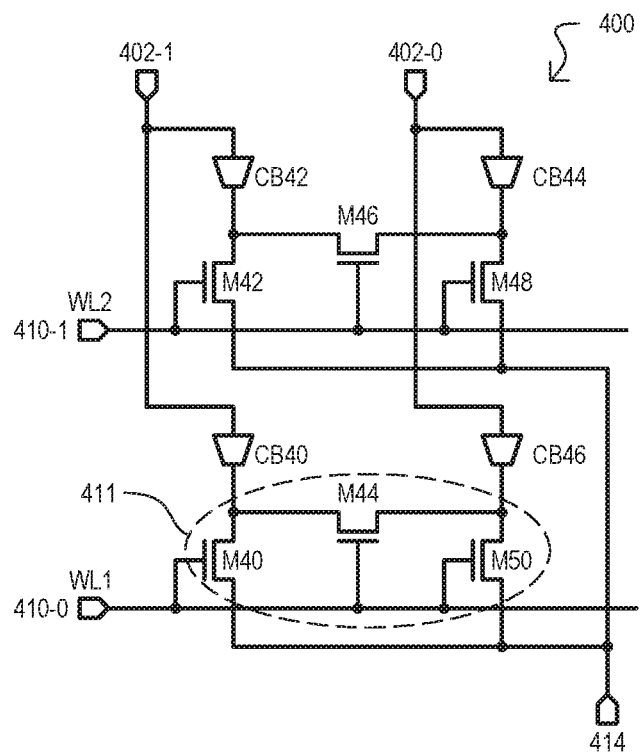

FIG. 4B is a schematic diagram of a memory device 400 like that shown in FIG. 4A. The addition of lateral transistor structures (M46, M44) can create an effective wide channel arrangement 411, which can increase current available for a programming operation, such as an erase of a CBRAM element, as but one particular example. In addition, lateral transistor structures (M46, M44) can eliminate or reduce any leakage current paths between adjacent storage contacts.

Referring still to FIG. 4B, in a program operation a storage element can be selected while others are deselected. For example, in a program operation that selects storage element CB40 for programming (and deselects the other elements CB42, CB44, CB46), a first word line (WL1) (i.e., gate structure 410-0) for the access transistor (420) of the selected storage element can be driven to a WL program select potential, while the second word line (WL2) (i.e., gate structure 410-1) can be driven to a WL program deselect potential. In addition, a plate 402-1 for the selected storage element can be driven to a plate program select potential, while other plates (e.g., 402-0) can be driven to a plate program deselect potential. In some embodiments, the WL program select potential is higher than the WL program deselect potential, and the plate program select potential is higher than the plate program deselect potential. However, in alternate embodiments the potential differences can be the opposite.

In some particular embodiments, WL program select potential can be between about 0.5 to 1.7 volts, between about 0.7 and 1.5 volts, or about 1.2 volts. A WL program deselect potential can be lower than the WL program select potential by about 1.7 volts, by about 1.5 volts, or by about 1.2 volts. A plate program select potential can be between about 5 to 1.5 volts, between about 3.3 and 2.5 volts, or about 3 volts. A plate program deselect potential can be about lower than the plate select potential by about 5 volts, by about 3.3 volts, or by about 3 volts. A bit line program voltage can be lower than a plate select voltage. In some embodiments, a bit line program voltage can be the same as a plate program deselect voltage.

Referring still to FIG. 4B in the program operation, access transistor M42 can be turned off, while access transistor M40 can be turned on, creating a conductive path between storage element CB40 and bit line 414. Consequently, the difference between the plate program select voltage and bit line program voltage can result in a programming current flowing from plate structure 402-1 through selected storage element CB40 to bit line 414. Such a flow of current can program the selected storage element CB40 to a desired impedance state (e.g., low resistance).

Referring still to FIG. 4B, in some embodiments, erase operations can occur in a similar fashion as a program operation, selecting one storage element while deselecting the other storage elements. For example, in an erase operation that selects storage element CB40 for erase (and deselects the other elements CB42, CB44, CB46), a first word line (WL1) can be driven to an erase select potential, while the second word line (WL2) can be driven to a WL erase deselect potential. Further, a plate 402-1 can be driven to a plate erase select potential, while other plates 402-0 can be driven to a plate erase deselect potential. In some embodiments, a WL erase select potential can be greater in magnitude than a WL program select potential. In addition, a difference between a plate erase select potential and a plate erase deselect potential can have a polarity that is the opposite of that used in the program operation. That is, the electric field across a selected storage element in the erase operation can be opposite to that of the program operation. A bit line erase voltage can be higher than a plate erase select voltage. In some embodiments, a bit line program voltage can be the same as a plate erase deselect voltage.

In some particular embodiments, WL erase select potential can be between about 0.7 to 3.3 volts, between about 1 and 3 volts, or about 2.8 volts. A WL erase deselect potential can lower than the WL erase select potential by about 3.3 volts, by about 3 volts, or by about 2.8 volts. A plate erase deselect potential can be between about 1 to 3 volts, between about 1.7 and 2.2 volts, or about 1.8 volts. A plate erase select potential can be about lower than the plate erase deselect potential by about 2.5 volts, by about 2 volts, or by about 1.8 volts. A bit line erase voltage can be greater than a plate erase select voltage. In some embodiments, a bit line erase voltage can be the same as a plate deselect voltage.

Figure 5A:
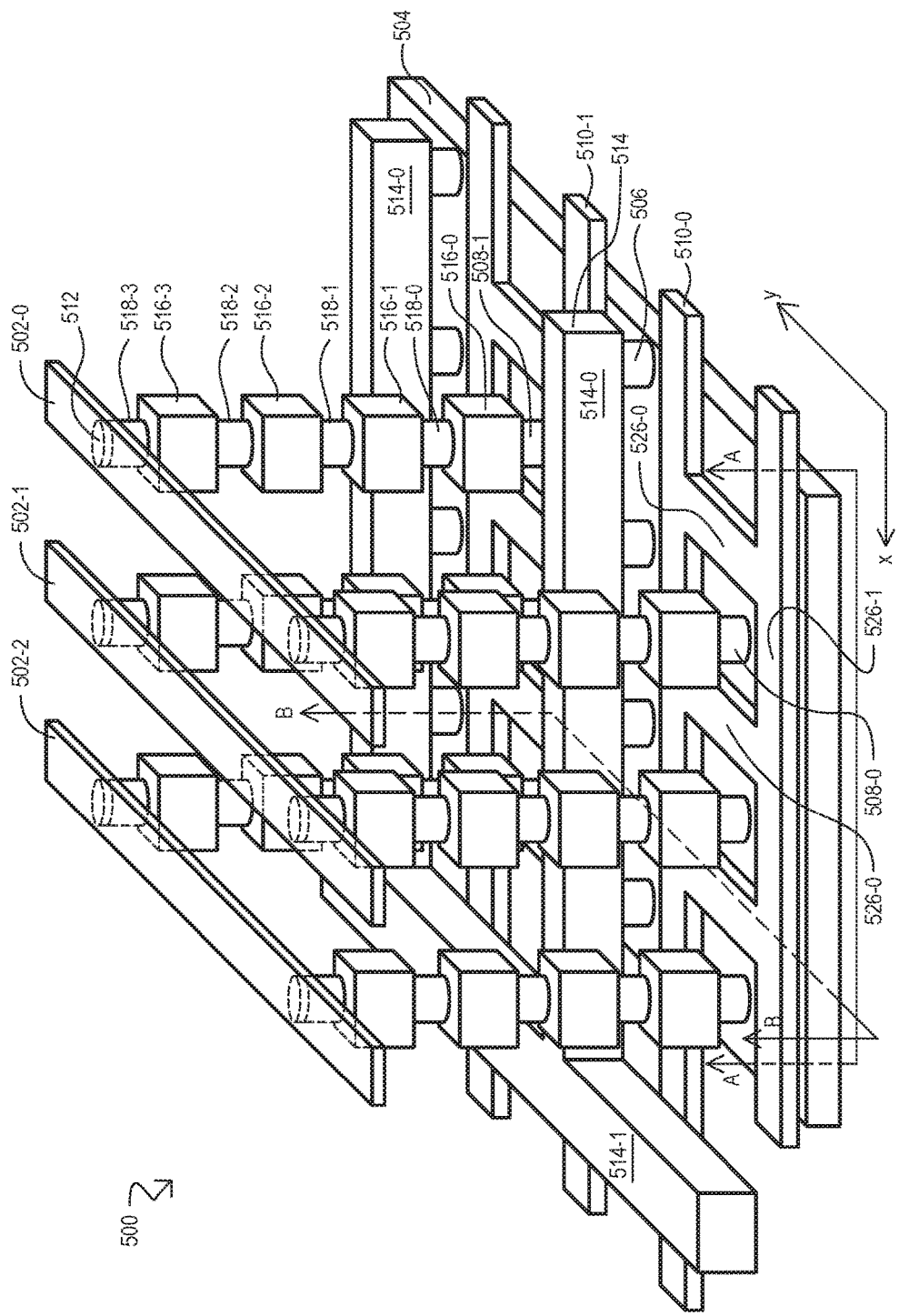
FIGS. 5A to 5C are diagrams showing a memory device according to a further embodiment.
Figure 5B:
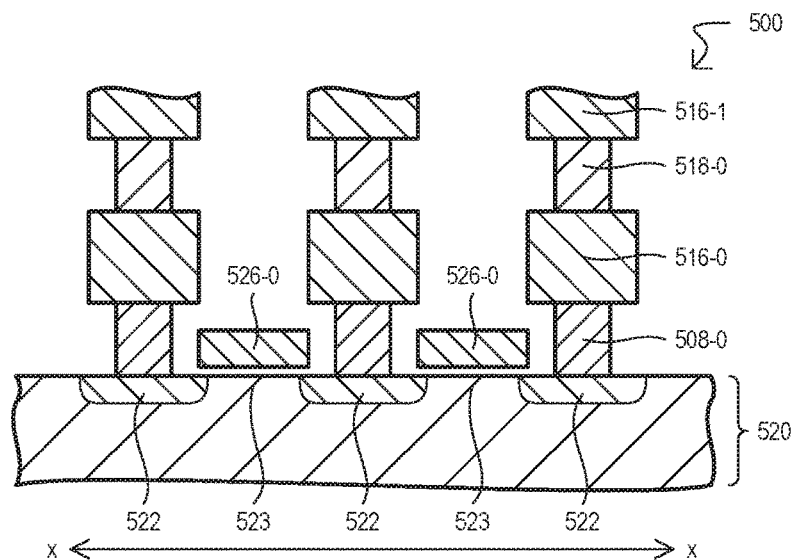
Figure 5C:
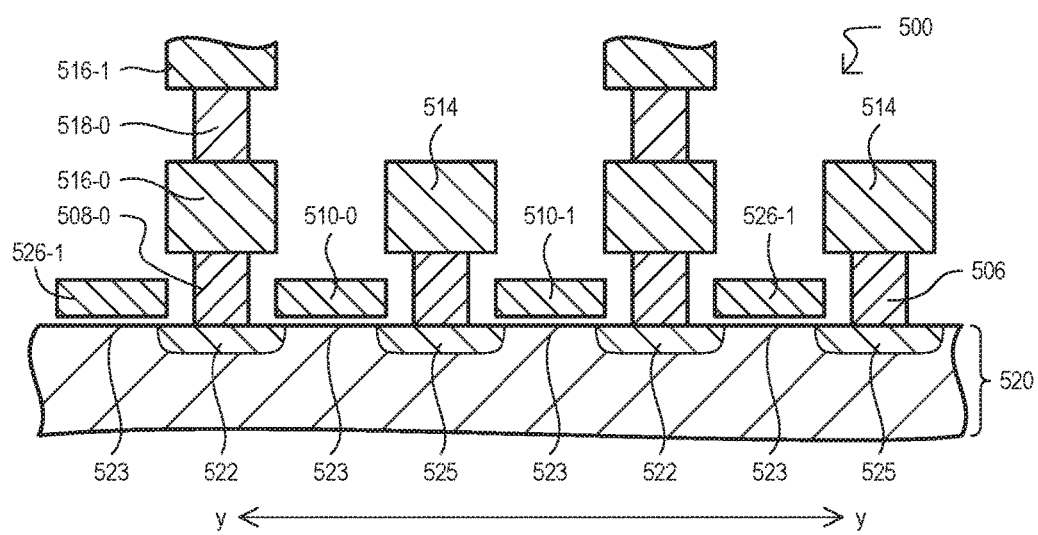

FIGS. 5A to 5C are diagrams of a memory device 500 according to a further embodiment. A memory device 500 can include items like those shown in FIGS. 3A/B.

Memory device 500 can differ from that shown in FIGS. 3A/B in that gate structures 510-0/1 can include gate extensions that surround storage contacts. While such surrounding gate structures can take various forms, in the embodiment of FIG. 5A, gate extensions can include first extensions (two shown as 526-0) that extend away from a main gate structure section, and second extensions (one shown as 526-1) that connect the first extensions 526-0. Alternatively, an arrangement like that of FIG. 5A can be conceptualized as having two gate structures in parallel (e.g., 510-0 and 526-1) on both sides of a group of storage contacts, with the two gate structures being connected by first extensions 526-0.

Referring to FIG. 5B, a memory device 500 is shown in a partial, side cross-sectional view taken along line A-A of FIG. 5A (x-direction). A memory device 500 can appear like that shown in FIG. 3B, with gate extensions 526-0 projecting between storage contacts (e.g., 508-0) to form lateral transistor structures.

Referring to FIG. 5C, a memory device 500 is shown in a partial, side cross-sectional view taken along line B-B of FIG. 5A (y-direction). FIG. 5C shows higher doped regions 522 (e.g., source/drains for access transistor structures) for storage contacts 508-0 as well as higher doped regions 525 for bit line contacts (e.g., 506). Main gate structures 510-0/1 can control an access path between storage contacts (e.g., 508-0) and bit lines 514, while gate extensions 526-1 can complete a gate structure that surrounds each storage contact (e.g., 508-0).

As understood with reference to FIGS. 5B and 5C, gate structures 510-0 with gate extensions 526-0/1 can provide a surrounding channel region 523 around each storage contact 508-0. Such a structure can ensure deselected storage elements (not shown, but conductively connected to storage contacts, 508-0) are isolated when selected storage elements are accessed, such as during programming and other operations (e.g., program, erase or even read). At the same time, the structure can provide greater current during programming-type operations (e.g., CBRAM erase) as compared to conventional approaches like those noted above.

Figure 6A:
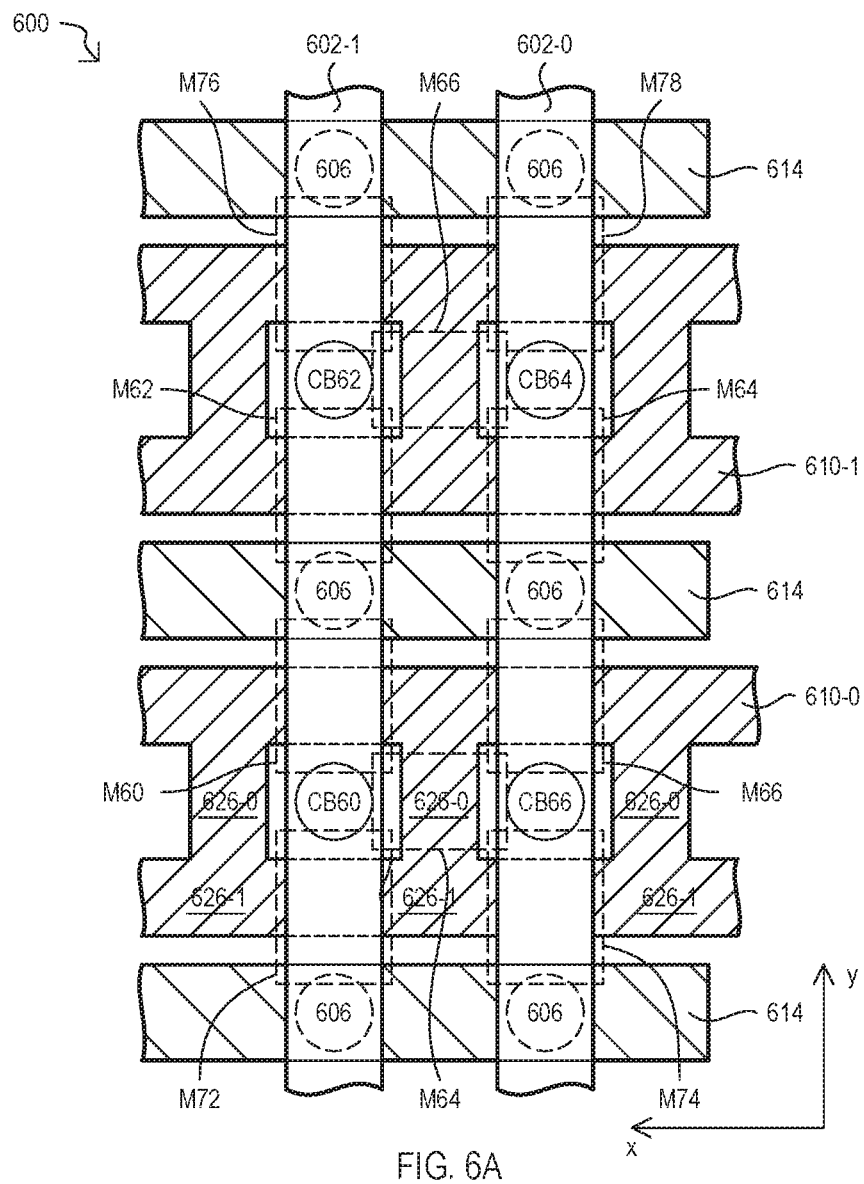
FIGS. 6A and 6B are a top plan view and schematic diagram for a memory device like that of FIGS. 5A to 5C.

FIG. 6A is a top plan view of a memory device 600 like that shown in FIGS. 5A to 5C. FIG. 6A presents a view like that of FIG. 4A, including two gate structures 610-0/1, a bit line 614 (i.e., three different portions of a same bit line), bit line contacts 606, four memory elements CB60/CB62/CB64/CB66, and two plate structures 602-0/1. Unlike FIG. 4A, gate structures 610-0/1 can include first gate extensions 626-0 that extend between adjacent storage contacts, as well as second gate extension(s) 626-1, which can join first gate extensions 626-0. As noted above, second gate extension(s) 626-1 can also be conceptualized as a gate structure parallel to the main portion 610-0.

The gate structure arrangement of FIG. 6A can be conceptualized as forming lateral transistor structures M64/M66 and opposing transistor structures M72/M74/M76/M78. Such a structure can provide greater current flow in programming operations, as well as isolation for deselected storage elements, that are not present in conventional approaches, like those noted above.

It is understood that the sizes and spacing of the various structures shown in FIG. 6A can be subject to considerable variation according to the fabrication process used.

Figure 6B:
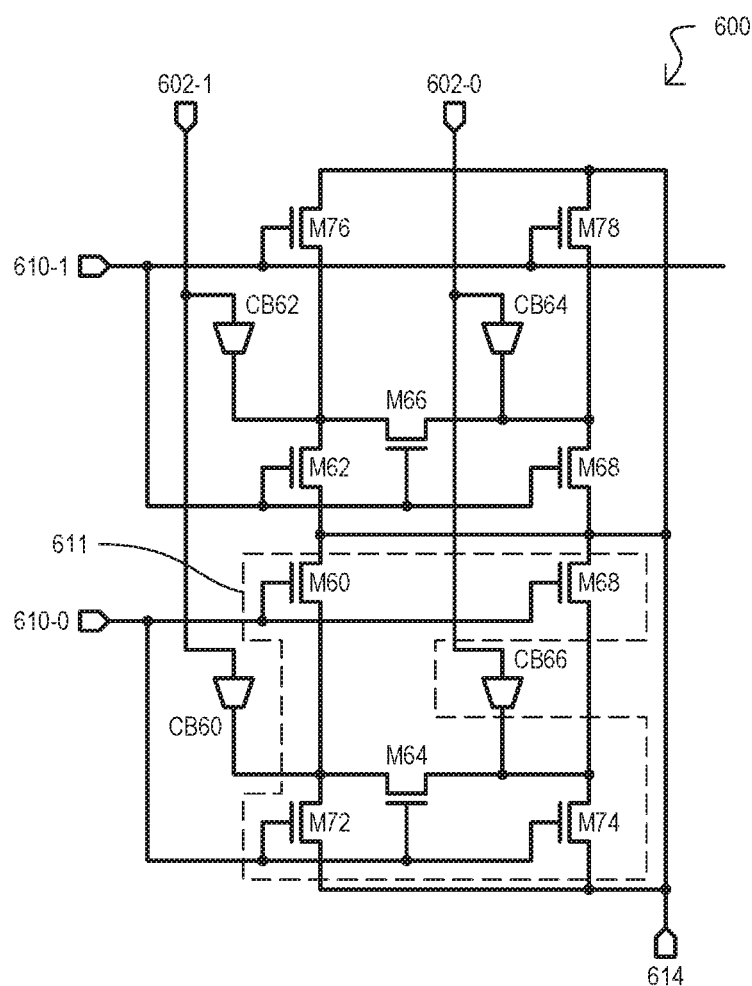

FIG. 6B is a schematic diagram of a memory device 600 like that shown in FIG. 6A. The various transistor structures are labelled as in FIG. 6A. The sets of transistor structures can create an effective wide channel arrangement 611, which can increase current available for programming operation, such as an erase of a CBRAM element, as but one particular example. In addition, such transistor structures (e.g., M60/M64/M70/M72/M74) can eliminate or reduce any leakage current paths between adjacent storage contacts.

In particular embodiments, selection and deselection of memory elements for programming can follow those described for FIG. 4B.

In embodiments described herein, a memory device can include plate structures that can be separately driven when accessing memory elements. Such accesses can include, for example, programming of elements between different impedance states (e.g., program/erase) and/or reading data from such memory elements.

Figure 7:
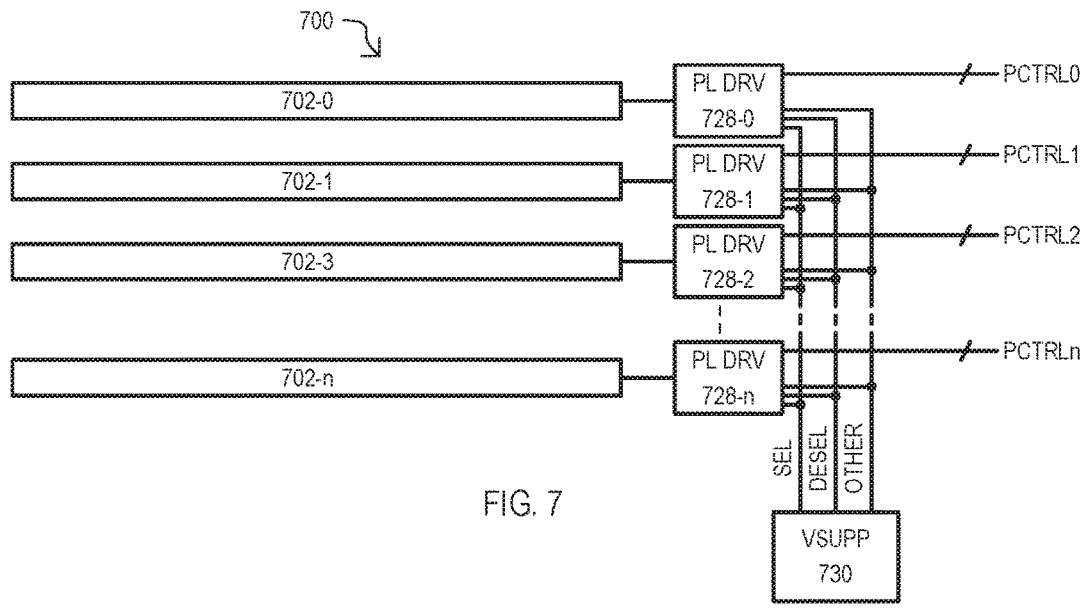
FIG. 7 is a diagram showing a plate structure driving arrangement that can be included in embodiments.

FIG. 7 is a block schematic diagram showing a memory device 700 having a plate control arrangement that can be included in embodiments. Memory device 700 can include a number of plate structures 702-0 to -n, each connected to a plate driver 728-0 to -n, and a voltage supply circuit 730. Plate structures (702-0 to -n) can be connected to, and/or form part of, a number of storage elements as described herein, or equivalents. Plate drivers (728-0 to -n) can drive their respective plate structures (702-0 to -n) between different voltages to access and/or program storage elements. In the particular embodiment shown, each plate driver (728-0 to -n) can receive one or more select voltages (SEL), one or more deselect voltages (DESEL), and optionally, other voltages (OTHER). In particular embodiments, SEL and DESEL voltages can vary according to operation (e.g., program, erase, read). A particular voltage can be applied by plate driver (728-0 to -n) according to corresponding control signals PCTRL0 to PCTRLn.

Various SEL and DESEL voltages can be provided by a supply voltage circuit 730. In some embodiments, one or more of the SEL or DESEL voltages can be a high power supply or low power supply (e.g., ground).

Figure 8:
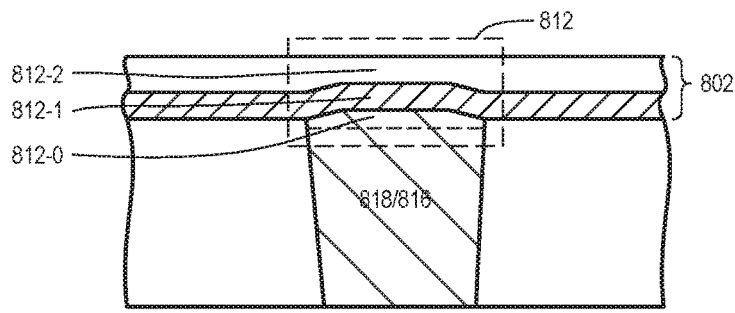
FIG. 8 is a side cross sectional view of a storage element that can be included in embodiments.

FIG. 8 shows a storage element 812 that can be included in embodiments. A storage element 812 can be formed by a vertical arrangement of three or more layers. In FIG. 8, a storage element 812 can include a first electrode layer 812-0, a memory layer 812-1 and a second electrode layer 812-2. In some embodiments, a first electrode layer 812-0 can be formed, all or in part, by a lower conductive structure of an integrated circuit device, such as a via 818 or a part of a metallization layer 816.

A memory layer 812-1 can be one layer, or include one or more sub-layers, and can be programmed between two or more impedance states. In some embodiments, a memory layer 812-1 can be switched between impedance states by, at least in part, an oxidation-reduction reaction induced by the application of electric fields. In a very particular embodiment, a storage element 812 can be CBRAM type element.

It is understood that while a memory layer 812-1 is shown as part of a plate structure 802, in other embodiments, a memory layer 812-1 can be formed within an opening above first electrode layer 812-0. Further, alternate embodiments can include memory elements that are not formed by vertically arranged layers.

Figure 9:
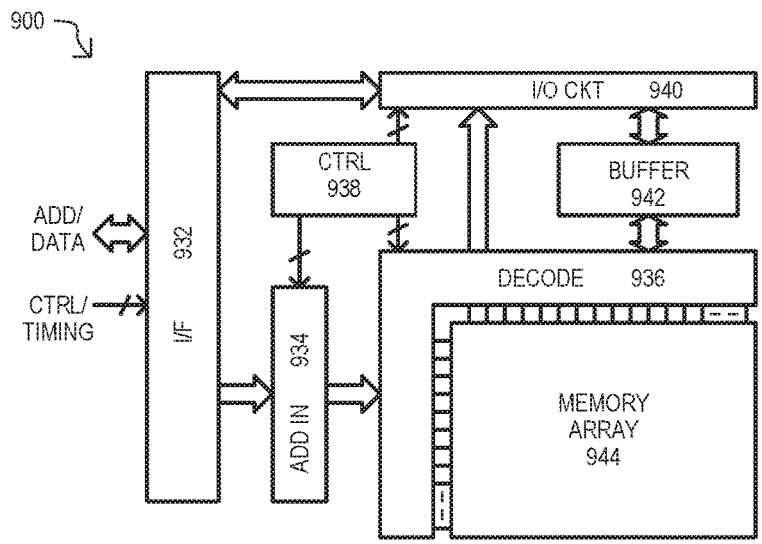
FIG. 9 is a block schematic diagram of a memory device according to another embodiment.

FIG. 9 is a diagram of a memory device 900 according to another embodiment. A memory device 900 can include a memory array 944, decoder circuits 936, an interface 932, and control circuits 938. A memory array 944 can include an architecture for accessing storage elements as described in the embodiments herein, including various "common bit line, independent plate" type architectures.

Decoder circuits 936 can generate select and deselect signals for accessing storage elements within memory array 944. In particular embodiments, decoder circuits can drive plate structures and word lines to different levels in programming and/or read operations based on received addresses and/or control inputs. Interface 932 can receive control inputs for accessing memory array 944 and can include data outputs for providing data from memory array 944. In some embodiments, an interface 932 can have inputs for receiving address values, control values, and input data values, and can have an output for providing data values. An interface 932 can be a serial interface and/or a parallel interface. Control circuits 938 can provide control and in some embodiments, timing signals, to other parts of the memory device 900 in response to control inputs.

In the particular embodiment shown, memory device 900 can also include an address latch 934, I/O circuits 940, and data buffer 942. Address latch 934 can latch address values and provide them to decoder circuits 936. I/O circuits 940 can receive write data for input to, and read data that has been output from memory array 944. A data buffer 942 can buffer write data for subsequent programming into memory array 944 and/or can buffer read data output from the memory array 944, for subsequent output from the memory device 900.

In a particular embodiment, a memory device 900 can be compatible with NOR type flash memory devices. However, in other embodiments, a memory device 900 can be compatible with other memory types, including but not limited to, a random access memory or NAND type flash device.

Figure 10:
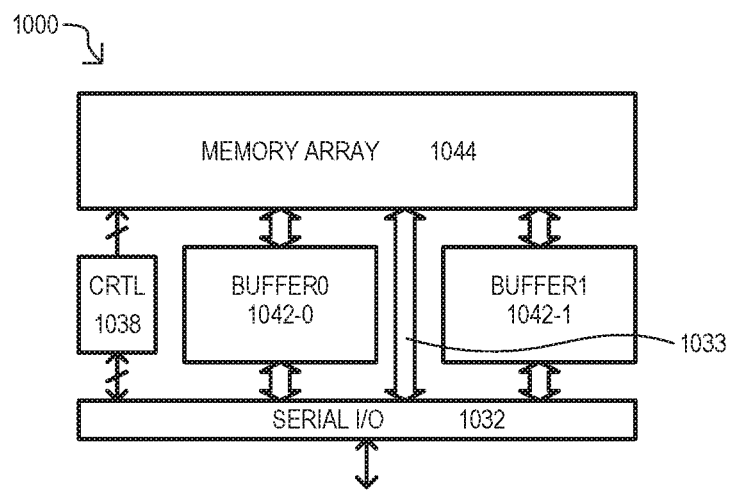
FIG. 10 is block schematic diagram of a memory device according to another embodiment.

FIG. 10 is a diagram of a memory device 1000 according to another embodiment. A memory device 1000 can include a memory array 1044, a first buffer 1042-0, a second buffer 1042-1, a serial interface 1032, and control circuits 1038. A memory array 1044 can include architectures described herein, or equivalents, including "common bit line, independent plate" type architectures.

Buffer circuits 1042-0/1 can store predetermined sets of data for rapid reading and/or writing to memory array 1044. In particular embodiments, buffer circuits 1042-0/1 can be dynamic memory circuits, such as static or dynamic random access memory (SRAM or DRAM), that allow for rapid reading and writing speeds. Data can be loaded from memory array 1044 into a buffer 1042-0/1 as a group (e.g., page or block). Such data can then be read at faster speeds from the device via the buffer 1042-0/1. Conversely, a data set within a buffer 1042-0/1 can be rapidly altered via write operations to the memory device 1000. Such altered/revised data can then be written (e.g., programmed) into memory array 1044 as a group (e.g., page or block). A memory device 1000 can also provide direct access to memory array 1044 from interface 1032 via direct path 1033. Control circuits 1038 can provide control and in some embodiments, timing signals, to other parts of the memory device 1000 in response to control inputs received at the serial interface 1032.

Figure 11:
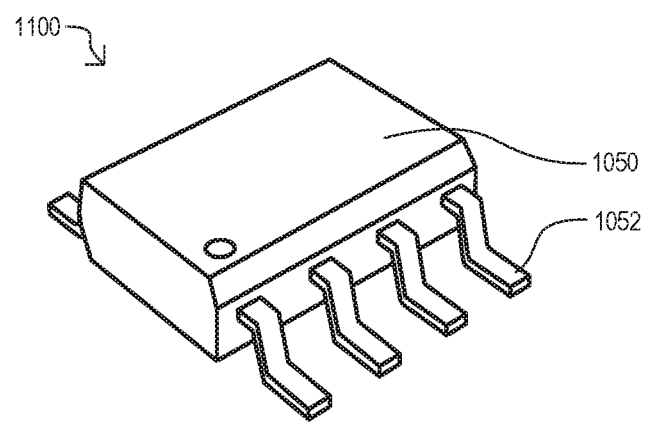
FIG. 11 is a perspective view of a memory device according to one particular embodiment.

FIG. 11 shows a memory device 1100 according to another embodiment. A memory device can include architectures described herein, or equivalents, including "common bit line, independent plate" type architectures implemented on an integrated circuit (IC) included within an IC package 1050. An IC package 1050 can include physical connections (one shown as 1052) to enable input signals to be applied to the memory device 1100, and data to be input and/or output from the memory device 1100.

It is understood that FIG. 11 shows but one very particular IC package type, and alternate embodiments can take the form of any other suitable IC package, including "multi-chip" type packages.

Figure 12A:
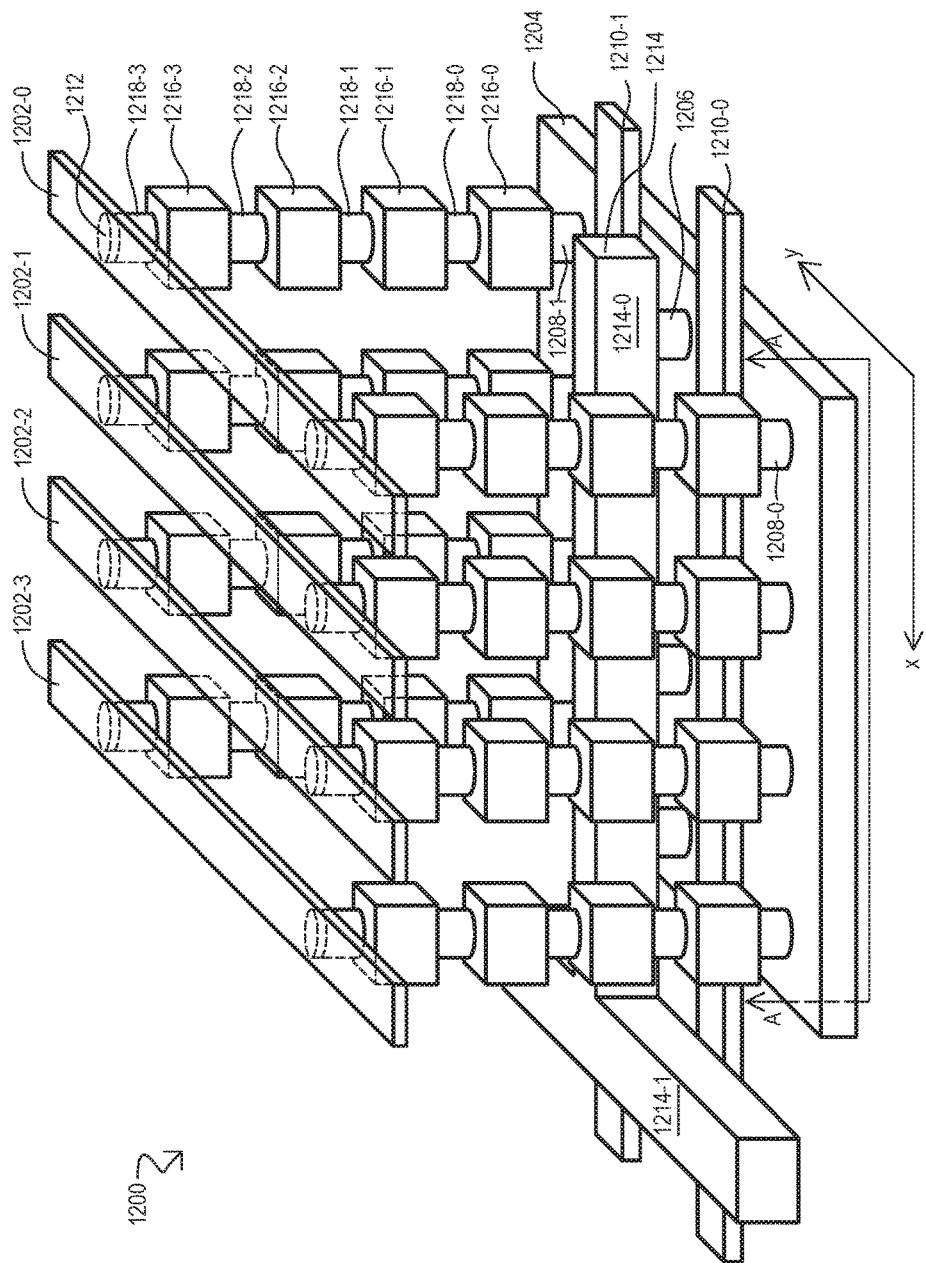
FIGS. 12A and 12B are diagrams showing a memory device according to another embodiment.
Figure 12B:
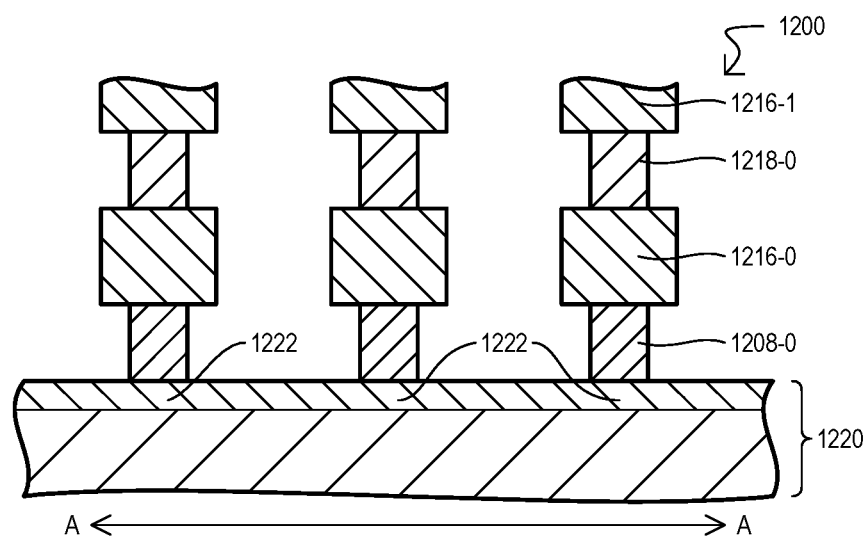

FIGS. 12A and 12B are diagrams of a memory device 1200 according to another embodiment. A memory device 1200 can include items like those shown in FIGS. 3A to 3C.

Memory device 1200 can differ from that shown in FIGS. 3A to 3C in that gate structures 1210-0/1 do not include gate extensions between adjacent storage contacts, such as those shown as 326-0/1.

Referring to FIG. 12B, a memory device 1200 is shown in a partial, side cross-sectional view taken along line A-A of FIG. 12A (in the x-direction). A substrate 1220 can include higher doped regions 1222, which can form sources or drains of access transistors. Storage contacts (e.g., 1208-0) can contact higher doped regions 1222. As shown, there are no lateral isolation structures, such as those shown as 127 in FIG. 1C. It is understood that while embodiments may not include lateral isolation structures, embodiments can include substrates having vertical isolation structures, as noted above. Also, while FIG. 12B shows a higher doped region 1222 that is contiguous, in other embodiments, there can be separate higher doped regions corresponding to each storage contact (e.g., 1208-0).

A memory 1200 can be subject to the same variations in materials as noted for FIGS. 3A to 3C.

Figure 13:
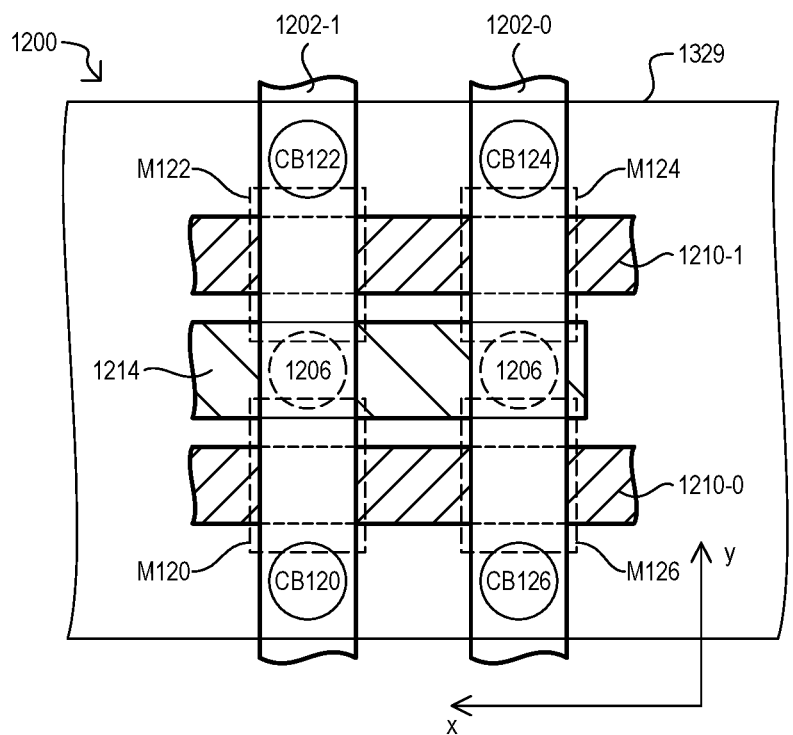
FIG. 13 is a top plan view for a memory device like that of FIGS. 12A/B.

FIG. 13 is a top plan view of a memory device 1300 like that of FIGS. 12A/B. FIG. 13 shows two gate structures 1210-0/1, a bit line 1214, bit line contacts 1206 (of a same bit line group), four memory elements CB120/CB122/CB124/CB126, and two plate structures 1202-0/1. Active area edge 1329 shows the extents of an active area, and can represent the delineation between an active area and isolation structure.

As shown in FIG. 13, gate structures 1210-0/1 can form access transistors M120/M122/M124/M126 between bit line contacts 1206 and storage contacts (below memory elements CB120/CB122/CB124/CB126). Gate structures 1210-0/1 can commonly control access transistors of a same row, and so can be considered word lines (WLs).

It is understood that the sizing and spacing of the various structures shown in FIG. 13 can be subject to considerable variation according to the fabrication process used.

Figure 14A:
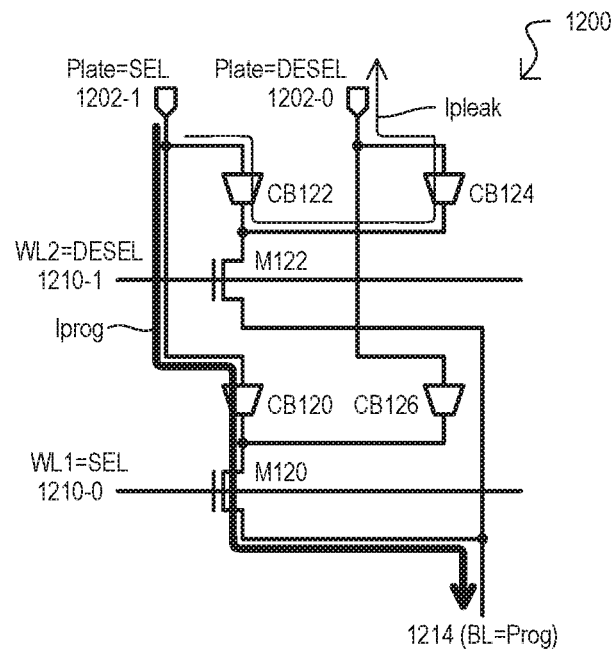
FIGS. 14A and 14B are schematic diagrams for a memory device like that of FIGS. 12A/B.
Figure 14B:
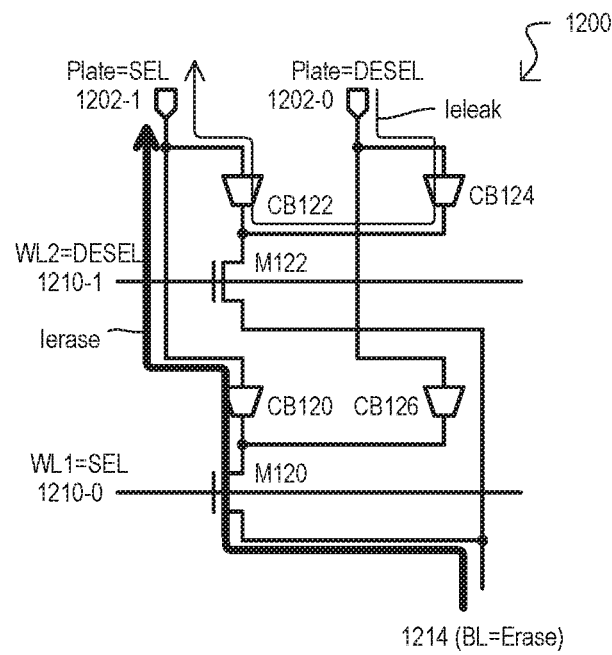

FIGS. 14B and 14B are schematic diagrams of a memory device 1200 like that shown in FIG. 13. In the particular embodiment shown storage elements CB120/CB122/CB124/CB126 can be programmed by application of electric fields which cause a current to flow through the element. FIG. 14A shows one programming operation, which can occur in a manner like that described in conjunction with FIG. 4B. A programming current is shown as Iprog. FIG. 14B shows one erase operation, which can occur in a manner like that described in conjunction with FIG. 4B. An erase current is shown as Ierase.

Embodiments like those of FIGS. 12A/B, 13 and 14A/B can provide larger absolute current in programming operations (i.e., an erase operation) than other architectures like that shown in FIGS. 1A to 1D, as an overall channel size when accessing a storage element can be larger.

However, in some applications or technologies, undesirable leakage current can develop that flows through deselected elements corresponding to a deselected word line (CB122 and CB124 in the example shown). Such leakage currents are shown as Ipleak in FIG. 14A and Ieleak in FIG. 14B. Such leakage currents may reduce the overall current applied to a selected storage element, resulting in inadequate erase and/or program, or may result in a "soft" programming or erasing of a deselected storage element.

It should be appreciated that reference throughout this description to "one embodiment" or "an embodiment" means that a particular feature, structure or characteristic described in connection with the embodiment is included in at least one embodiment of an invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It is also understood that other embodiments of this invention may be practiced in the absence of an element/step not specifically disclosed herein.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A memory device, comprising: at least one plate structure formed over a semiconductor substrate; an active region formed within the semiconductor substrate without lateral isolation structures; a plurality of bit line contact groups, each including bit line contacts to the active region disposed in a first direction; a plurality of storage contact groups, each including storage contacts to the active region disposed in the first direction; to a plurality of gate structures, each including a main section extending in the first direction, and disposed between one bit line contact group and an adjacent storage contact group; and a two-terminal storage element disposed between each bit line contact and the at least one plate structure, wherein each gate structure further includes a plurality of second sections that extend from the main section at least between adjacent storage contacts of the adjacent storage contact group.

2. The memory device of claim 1, wherein each gate structure further includes a plurality of second sections that laterally surround each storage contact of the adjacent storage contact group.

3. The memory device of claim 1, wherein the at least one plate structure comprises a plurality of plate structures, each plate structure being electrically connected to a different group of storage elements.

4. The memory device of claim 3, wherein each plate structure has an elongated shape with longer sides extending in a second direction different than the first direction.

5. The memory device of claim 1, wherein:
each storage contact comprises structures formed from a plurality of different metallization layers; wherein
each metallization layer is formed at a different vertical distance above the substrate.

6. The memory device of claim 1, wherein:
each storage element includes
a first electrode,
a second electrode, and
at least one memory layer programmable between at least two different impedance states in response to the application of electric fields between the first and second electrodes.

7. The memory device of claim 6, wherein:
at least part of a programming of the at least one memory layer includes any selected from the group of:
an oxidation-reduction reaction, and
solid ion conduction.

8. The memory device of claim 1, further including:
a plurality of bit lines, each bit line including
a first portion electrically connected to a corresponding group of bit line contacts and extending in the first direction, wherein
the first portion is formed of a metallization layer disposed above the gate structure and below the at least one plate structure.

9. The memory device of claim 8, wherein each bit line further includes a second portion formed of the metallization layer and disposed in second direction different than the first direction.

* * * * *